(12) United States Patent
Nichol (10) Patent No.: US 7,883,680 B2
(45) Date of Patent: Feb. 8, 2011

(54) METHOD FOR PURIFYING SILICON (75) Inventor: Scott Nichol, Toronto (CA)

(73) Assignee: 6N Silicon Inc., Vaughan, Ontario (CA)

( * ) Notice: Subject to any disclaimer, the term of this patent is extended or adjusted under 35 U.S.C. 154(b) by 0 days.

(21) Appl. No.: 12/784,576

(22) Filed: May 21, 2010

(65) Prior Publication Data

US 2010/0233064 A1     Sep. 16, 2010

Related U.S. Application Data (63) Continuation of application No. 12/288,857, filed as application No. PCT/CA2007/000574 on Apr. 4, 2007, now Pat. No. 7,727,503.

(60) Provisional application No. 60/788,708, filed on Apr. 4, 2006.

(51) Int. Cl.
*C01B 33/02* (2006.01)

(52) U.S. Cl. .................. 423/350; 423/348; 423/349; 423/495; 156/64; 427/255.18; 427/255.24; 427/314

(58) Field of Classification Search .................. 423/350, 423/348, 349, 495; 156/64; 427/255.18, 427/255.24, 314
See application file for complete search history.

(56) References Cited

U.S. PATENT DOCUMENTS

| | | | |
|---|---|---|---|
| 4,094,731 A | 6/1978 | Keyser et al. | |
| 4,200,621 A | 4/1980 | Liaw et al. | |
| 4,312,847 A | 1/1982 | Dawless | |
| 4,312,849 A | 1/1982 | Kramer | |
| 4,900,532 A | 2/1990 | Kurz et al. | |
| 6,585,797 B2 | 7/2003 | Kinosz et al. | |
| 6,632,413 B2 | 10/2003 | Clark et al. | |
| 7,727,503 B2 | 6/2010 | Nichol | |
| 2005/0139148 A1 | 6/2005 | Fujiwara et al. | |
| 2009/0274607 A1 | 11/2009 | Nichol | |

FOREIGN PATENT DOCUMENTS

WO    WO-2007112592 A1    10/2007

OTHER PUBLICATIONS

"U.S. Appl. No. 12/288,857, Non-Final Office Action mailed Sep. 24, 2009", 9.
"U.S. Appl. No. 12/288,857, Notice of Allowance mailed Apr. 5, 2010", 7 pgs.
"U.S. Appl. No. 12/288,857, Preliminary Amendment filed Oct. 23, 2008", 18 pgs.
"U.S. Appl. No. 12/288,857, Response filed Dec. 21, 2009 to Non Final Office Action mailed Sep. 24, 2009", 10 pgs.
"Australia Application No. 2007234343 , Offfice Action mailed on Feb. 17, 2010", 2.
"International Application Serial No. PCT/CA2007/000574, Preliminary Report on Patentability", 8 pgs.
"International Application Serial No. PCT/CA2007/000574, Search Report and Written Opinion", 13 pgs.
"Malaysian Application Serial No. PI 20083943, Office Action mailed Nov. 13, 2008", 42 pgs.

*Primary Examiner*—Timothy C Vanoy
*Assistant Examiner*—Michelle Hou
(74) *Attorney, Agent, or Firm*—Schwegman, Lundberg & Woessner, P.A.

(57) ABSTRACT

The present invention provides for methods of purifying silicon, methods for obtaining purified silicon, as well as methods for obtaining purified silicon crystals, purified granulized silicon and/or purified silicon ingots.

20 Claims, 6 Drawing Sheets

METHOD FOR PURIFYING SILICON

RELATED APPLICATION

Continuation of application Ser. No. 12/288,857, filed on Oct. 23, 2008, now U.S. Pat. No. 7,727,503, which is a U.S. National Stage Filing under 35 U.S.C. 111(a) from International Patent Application Serial No. PCT/CA2007/000574, filed Apr. 4, 2007, and published on Oct. 11, 2007 as WO 2007/112592 A1, which claims the benefit under 35 U.S.C. 119(e) of U.S. Provisional Application Ser. No. 60/788,708; filed Apr. 4, 2006; the contents of which are incorporated herein by reference and made a part hereof in their entirety.

BACKGROUND OF THE INVENTION

Many different methods and apparatus have been described for reducing the amount of impurities in silicon, including, e.g., zone melting, the silane gas distillation, gas injection, acid leaching, slagging and directional solidification. However boron, phosphorous, titanium, iron and some other elements can only be eliminated with currently known processes to the required purity with great difficulty and/or expensive processing steps.

Currently silicon is typically purified by a process that involves reduction and/or thermal decomposition of an exceptionally pure vaporizable compound of silicon such as trichlorosilane. This process is very costly and capital-intensive way of producing silicon, that has a higher purity than is required for some application such as solar cells.

SUMMARY OF THE INVENTION

The present invention provides for methods of purifying silicon, methods for obtaining purified silicon, as well as methods for obtaining purified silicon crystals, purified granulized silicon and/or purified silicon ingots. The methods described herein can effectively provide commercial quantities (e.g., at least about 45 kg) of purified silicon, in a relatively cost-effective manner. More specifically, the methods described herein can effectively provide at least about 200 tons/year of purified silicon, at least about 500 tons/year of purified silicon, or at least about 1,000 tons/year of purified silicon, in a relatively cost-effective manner. The relatively pure silicon obtained can be, e.g., polycrystalline silicon or mono-crystalline silicon. Additionally, the relatively pure silicon obtained can be used to grow a multicrystalline or monocrystalline ingot or boule. The relatively pure silicon obtained can be employed in the manufacture of a solar panel or an integrated circuit.

The relatively pure silicon obtained can be purified from at least one of lithium (Li), boron (B), sodium (Na), titanium (Ti), iron (Fe), magnesium (Mg), vanadium (V), zinc (Zn), phosphorous (P), sulfur (S), potassium (K), calcium (Ca), strontium (Sr), chlorine (Cl), chromium (Cr), manganese (Mn), aluminum (Al), arsenic (As), antimony (Sb), gallium (Ga), indium (In), nickel (Ni) and copper (Cu). Specifically, the relatively pure silicon obtained can include any one or more of the following, each in less than about 10 ppm: lithium (Li), boron (B), sodium (Na), titanium (Ti), iron (Fe), magnesium (Mg), vanadium (V), zinc (Zn), phosphorous (P), sulfur (S), potassium (K), calcium (Ca), strontium (Sr), chlorine (Cl), chromium (Cr), manganese (Mn), aluminum (Al), arsenic (As), antimony (Sb), gallium (Ga), indium (In), nickel (Ni) and copper (Cu). More specifically, the relatively pure silicon obtained can include any one or more of the following, each in less than about 10 ppm: iron (Fe) and aluminum (Al). Additionally, the relatively pure silicon obtained can include any one or more of the following, each in less than about 1 ppm: lithium (Li), boron (B), sodium (Na), titanium (Ti), magnesium (Mg), vanadium (V), zinc (Zn), phosphorous (P), sulfur (S), potassium (K), calcium (Ca), strontium (Sr), chlorine (Cl), chromium (Cr), manganese (Mn), arsenic (As), antimony (Sb), gallium (Ga), indium (In), nickel (Ni) and copper (Cu).

The present invention provides a method for purifying silicon, the method includes: (a) forming a first molten liquid from silicon and a solvent metal selected from the group of copper, tin, zinc, antimony, silver, bismuth, aluminum, cadmium, gallium, indium, magnesium, lead, an alloy thereof, and combinations thereof; (b) contacting the first molten liquid with a first gas, to provide dross and a second molten liquid; (c) separating the dross and the second molten liquid; (d) cooling the second molten liquid to form first silicon crystals and a first mother liquid; and (e) separating the first silicon crystals and the first mother liquid.

The present invention also provides a method for purifying silicon, the method includes: (a) forming a first molten liquid from silicon and a solvent metal selected from the group of copper, tin, zinc, antimony, silver, bismuth, aluminum, cadmium, gallium, indium, magnesium, lead, an alloy thereof, and combinations thereof; (b) contacting the first molten liquid with a first gas to provide a second molten liquid and dross; (c) heating the second molten liquid; (d) separating the dross and the second molten liquid; (e) cooling the second molten liquid to form first silicon crystals and a first mother liquid; (f) separating the first silicon crystals and the first mother liquid; (g) heating the first silicon crystals to form a first molten bath; (h) directionally solidifying the first molten bath to form second silicon crystals and a second mother liquor; (i) heating the second silicon crystals to provide a second molten bath; (j) contacting the second molten bath with a second gas to form a slag that forms on the surface of a third molten bath; (k) separating the slag and the third molten bath; and at least one of steps (l)-(o): (l) cooling the second molten bath to form silicon ingots; (m) converting the second molten bath to granulized silicon; (n) introducing the third molten bath into a mold and cooling the third molten bath to form a second silicon; and (o) directionally solidifying the third molten bath below the melting point, thereby forming a third silicon crystals, and separating the upper portion and the lower portion; wherein the upper portion comprises a third mother liquor and the lower portion comprises a third silicon.

BRIEF DESCRIPTION OF THE DRAWINGS

Embodiments of the invention may be best understood by referring to the following description and accompanying drawings which illustrate such embodiments. The numbering scheme for the Figures included herein are such that the leading number for a given reference number in a Figure is associated with the number of the Figure. Reference numbers are the same for those elements that are the same across different Figures. For example, a block flow diagram depicting granulized silicon (148) can be located in FIG. 1. However, reference numbers are the same for those elements that are the same across different Figures. In the drawings.

DETAILED DESCRIPTION OF THE INVENTION

Reference will now be made in detail to certain claims of the invention, examples of which are illustrated in the accompanying structures and formulas. While the invention will be described in conjunction with the enumerated claims, it will be understood that they are not intended to limit the invention to those claims. On the contrary, the invention is intended to cover all alternatives, modifications, and equivalents, which may be included within the scope of the present invention as defined by the claims.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present invention relates to methods of purifying silicon, methods for obtaining purified silicon, as well as methods for obtaining purified silicon crystals, purified granulized silicon and/or purified silicon ingots. When describing the methods of purifying silicon, methods for obtaining purified silicon, as well as methods for obtaining purified silicon crystals, purified granulized silicon and/or purified silicon ingots, the following terms have the following meanings, unless otherwise indicated.

DEFINITIONS

Unless stated otherwise, the following terms and phrases as used herein are intended to have the following meanings:

In the methods of manufacturing described herein, the steps can be carried out in any order without departing from the principles of the invention, except when a temporal or operational sequence is explicitly recited. Recitation in a claim to the effect that first a step is performed, then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first, step E is carried out last, and steps B, C, and D can be carried out in any sequence between steps A and E, and that the sequence still falls within the literal scope of the claimed process.

Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

As used herein, "multiple" refers to two or more, e.g., 2, 3, 4 or 5.

As used herein, "purifying" refers to the physical separation of a chemical substance of interest from foreign or contaminating substances.

As used herein, "contacting" refers to the act of touching, making contact, or of immediate proximity.

As used herein, "crystallizing" includes the process of forming crystals (crystalline material) of a substance, from solution. The process separates a product from a liquid feedstream, often in extremely pure form, by cooling the feedstream or adding precipitants which lower the solubility of the desired product so that it forms crystals. The pure solid crystals are then separated from the remaining liquor by filtration or centrifugation.

As used herein, "crystalline" includes the regular, geometric arrangement of atoms in a solid.

As used herein, "decanting" or "decantation" includes pouring off a fluid, leaving a sediment or precipitate, thereby separating the fluid from the sediment or precipitate.

As used herein, "filtering" or "filtration" refers to a mechanical method to separate solids from liquids by passing the feed stream through a porous sheet such as a ceramic or metal membrane, which retains the solids and allows the liquid to pass through. This can be accomplished by gravity, pressure or vacuum (suction). The filtering effectively separates the sediment or precipitate from the liquid.

As used herein, "separating" refers to the process of removing a substance from another (e.g., removing a solid or a liquid from a mixture). The process can employ any technique known to those of skill in the art, e.g., decanting the mixture, skimming one or more liquids from the mixture, centrifuging the mixture, filtering the solids from the mixture, or a combination thereof.

As used herein, "filtering" refers to the process of removing solids from a mixture by passing the liquid through a filter, thereby suspending the solids on the filter.

As used herein, "decanting" refers to the process of pouring off a liquid without disturbing the sediment, or the process of pouring off a liquid with a minimal disturbance of the sediment.

As used herein, "centrifuging" refers to process that involves the use of the centripetal force for the separation of mixtures, e.g., solids from a mixture. Increasing the effective gravitational force on a test tube so as to more rapidly and completely cause the precipitate ("pellet") to gather on the bottom of the vesicle. The solution ("supernatant") can then be quickly decanted from the vesicle without disturbing the precipitate. The rate of centrifugation is specified by the acceleration applied to the sample, typically measured in revolutions per minute (RPM). The particle's settling velocity in centrifugation is a function of the particle's size and shape, centrifugal acceleration, the volume fraction of solids present, the density difference between the particle and the liquid, and the viscosity.

As used herein, "skimming" refers to the process of removing one or more liquids, solids of combination thereof from a mixture, wherein the one or more liquids are floating on top of the mixture.

As used herein, "agitating" refers to the process of putting a mixture into motion with a turbulent force. Suitable methods of agitating include, e.g., stirring, mixing, and shaking.

As used herein, "precipitating" refers to the process of causing a solid substance (e.g., crystals) to be separated from a solution. The precipitating can include, e.g., crystallizing.

As used herein, "mother liquor" refers to the solid or liquid obtained after solids (e.g., crystals) are removed from a mixture of a solution of solids in a liquid. As such, the mother liquor will not include an appreciable amount of these solids.

As used herein, "silicon" refers to the chemical element that has the symbol Si and atomic number 14. Measured by mass, silicon makes up 25.7% of the Earth's crust and is the second most abundant element on Earth, after oxygen. Pure silicon crystals are only occasionally found in nature; they can be found as inclusions with gold and in volcanic exhalations. Silicon is usually found in the form of silicon dioxide (also known as silica), and silicate. Silica occurs in minerals consisting of (practically) pure silicon dioxide in different crystalline forms (quartz, chalcedony, opal). Sand, amethyst, agate, quartz, rock crystal, flint, jasper, and opal are some of the forms in which silicon dioxide appears (they are known as "lithogenic", as opposed to "biogenic", silicas). Silicon also occurs as silicates (various minerals containing silicon, oxygen and one or another metal), for example feldspar. These minerals occur in clay, sand and various types of rock such as granite and sandstone. Asbestos, feldspar, clay, hornblende, and mica are a few of the many silicate minerals. Silicon is a principal component of aerolites, which are a class of meteoroids, and also is a component of tektites, which are a natural form of glass.

As used herein, "metallurgical grade silicon" refers to relatively pure (e.g., at least about 98.0 wt. %) silicon.

As used herein, "molten" refers to a substance that is melted, wherein melting is the process of heating a solid substance to a point (called the melting point) where it turns into a liquid.

As used herein, "solvent metal" refers to one or more metals, or an alloy thereof, which upon heating, can effectively dissolve silicon, resulting in a molten liquid. Suitable exemplary solvent metals include, e.g., copper, tin, zinc, antimony, silver, bismuth, aluminum, cadmium, gallium, indium, magnesium, lead, an alloy thereof, and combinations thereof.

As used herein, an "alloy" refers to a homogeneous mixture of two or more elements, at least one of which is a metal, and where the resulting material has metallic properties. The resulting metallic substance usually has different properties (sometimes significantly different) from those of its components.

As used herein, "liquidus" refers to a line on a phase diagram above which a given substance is stable in the liquid phase. Most commonly, this line represents a transition temperature. The liquidus may be a straight line, or it may be curved, depending upon the substance. The liquidus is most often applied to binary systems such as solid solutions, including metal alloys. The liquidus may be contrasted to the solidus. The liquidus and solidus do not necessarily align or overlap; if a gap exists between the liquidus and solidus, then within that gap, the substance is not stable as either a liquid or a solid.

As used herein, "solidus" refers to a line on a phase diagram below which a given substance is stable in the solid phase. Most commonly, this line represents a transition temperature. The solidus may be a straight line, or it may be curved, depending upon the substance. The solidus is most often applied to binary systems such as solid solutions, including metal alloys. The solidus may be contrasted to the liquidus. The solidus and liquidus do not necessarily align or overlap. If a gap exists between the solidus and liquidus, then within that gap, the substance is not stable as either a solid or a liquid; such is the case, for example, with the olivine (fosterite-fayalite) system.

As used herein "evolve" or "evolve a gas" refers to the process in which a liquid or solid will undergo a chemical reaction or decomposition to release a gas under certain conditions (typically high temperature).

As used herein, "dross" refers to a mass of solid impurities floating on a molten metal bath. It appears usually on the melting of low melting point metals or alloys such as tin, lead, zinc or aluminum, or by oxidation of the metal(s). It can be removed, e.g., by skimming it off the surface. With tin and lead, the dross can also be removed by adding sodium hydroxide pellets, which dissolve the oxides and form a slag. With other metals, salt fluxes can be added to separate the dross. Dross is distinguished from slag, which is a (viscous) liquid floating on the alloy, by being solid.

As used herein, "slag" refers to by-product of smelting ore to purify metals. They can be considered to be a mixture of metal oxides; however, they can contain metal sulphides and metal atoms in the elemental form. Slags are generally used as a waste removal mechanism in metal smelting. In nature, the ores of metals such as iron, copper, lead, aluminum, and other metals are found in impure states, often oxidized and mixed in with silicates of other metals. During smelting, when the ore is exposed to high temperatures, these impurities are separated from the molten metal and can be removed. The collection of compounds that is removed is the slag.

As used herein, "inert gas" refers to any gas, or combination of gases, that is not reactive under normal circumstances. Unlike the noble gases, an inert gas is not necessarily elemental and are often molecular gases. Like the noble gases, the tendency for non-reactivity is due to the valence, the outermost electron shell, being complete in all the inert gases. Exemplary inert gases include, e.g., helium (He), Neon (Ne), Argon (Ar) and nitrogen ($N_2$).

As used herein, "rotary degasser" refers to an apparatus for removing impurities from molten metal that includes a degasser shaft, an impeller block and a coupling. The shaft is preferably hollow to allow for the passage of gas therethrough. The impeller block is connected to the degasser shaft, is typically formed of heat resistant material and has at least one metal-transfer recess, which displaces molten metal when the block is rotated. The block preferably includes at least one gas inlet in communication with the hollow portion of the degasser shaft and a gas-release opening formed in each metal-transfer recess. Each gas-release opening communicates with one of the gas inlets. The coupling connects the degasser shaft to a drive shaft and is formed of two or more coupling members.

As used herein, "vortex" refers to a spinning, often turbulent, flow (or any spiral motion) with closed streamlines. The shape of media or mass swirling rapidly around a center forms a vortex. It flows in a circular motion.

As used herein, "directionally solidifying" refers to the solidification of molten metal so that feed metal is continually available for the portion undergoing solidification.

As used herein, "polycrystalline silicon" or "poly-Si" refers to a material consisting of multiple small silicon crystals.

As used herein, "monocrystalline silicon" refers to silicon that has a single and continuous crystal lattice structure with almost no defects or impurities.

As used herein, "ingot" refers to a mass of material cast into a shape which is relatively easy to handle and transport. For example, metal heated past its melting point and molded into a bar or block is referred to as an ingot.

As used herein, "boule" refers to a single-crystal ingot synthetically produced. For example, in the Czochralski or "CZ" process, a seed crystal is used to create a larger crystal, or ingot. This seed crystal is dipped into the pure molten silicon and slowly extracted. The molten silicon grows on the seed crystal in a crystalline fashion. As the seed is extracted the silicon sets and eventually a large, circular boule is produced.

As used herein, "granulized silicon" refers to silicon having a specified grain size of about 2-4 millimeters (mm).

The term "solar panel" refers to a photovoltaic module which is an assembly of solar cells used to generate electricity. In all cases, the panels are typically flat, and are available in various heights and widths. An array is an assembly of solar-thermal panels or photovoltaic (PV) modules; the panels can be connected either in parallel or series depending upon the design objective. Solar panels typically find use in residential, commercial, institutional, and light industrial applications.

As used herein, an "integrated circuit" (also known as IC, microcircuit, microchip, silicon chip, computer chip or chip) refers to a miniaturized electronic circuit (consisting mainly of semiconductor devices, as well as passive components) that has been manufactured in the surface of a thin substrate of semiconductor material.

As used herein, "mm" denotes millimeter, "ppm" denotes parts per million, "° C." refers to degrees Celsius, "wt. %" denotes weight percent, "hr" denotes hour, "kg" refers to kilogram, and "ppmwt. %" refers to parts per million weight percent.

Figure 1:
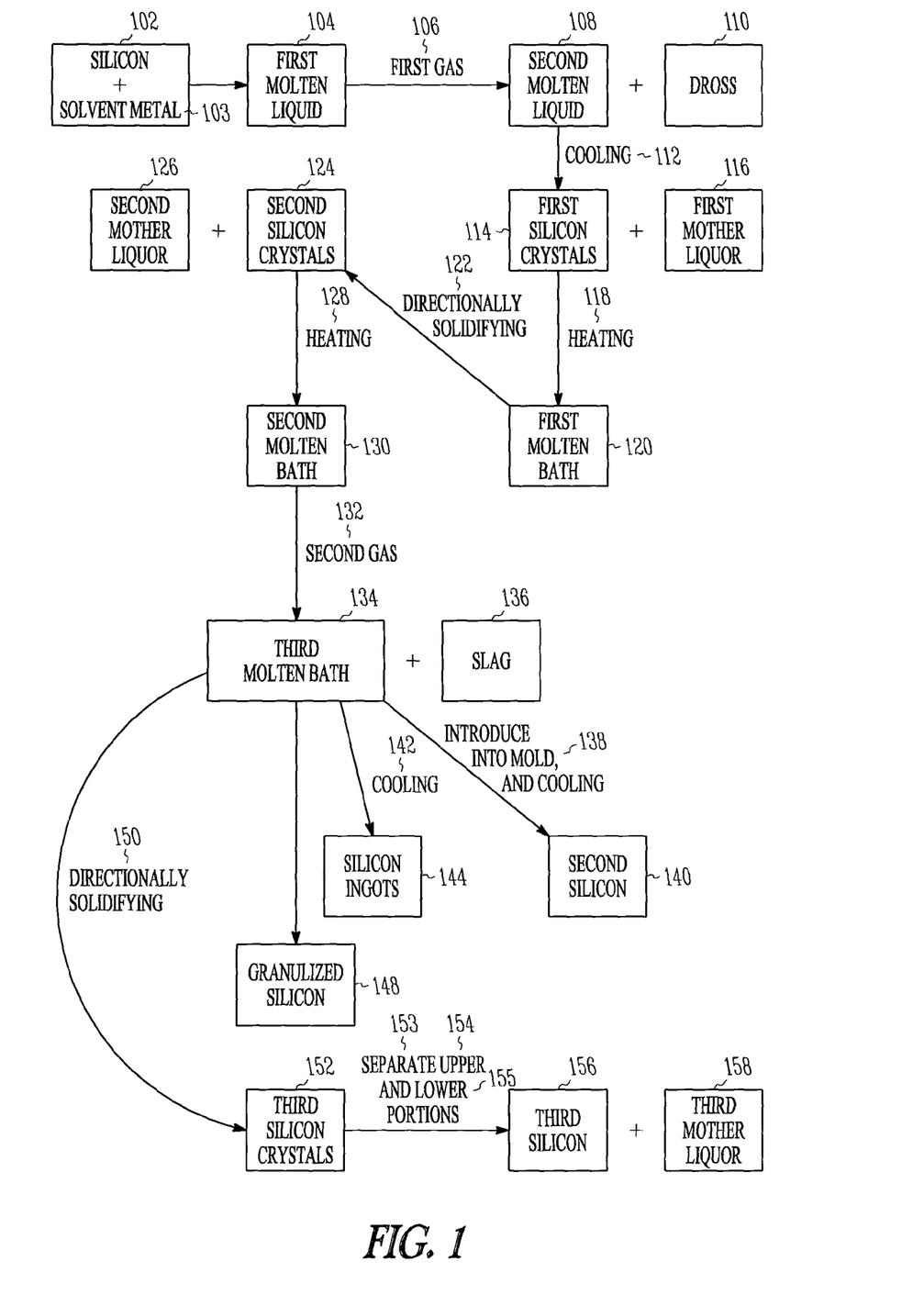
FIG. 1 illustrates a block flow diagram for methods of purifying silicon, methods for obtaining purified silicon, as well as methods for obtaining purified silicon crystals, purified granulized silicon and/or purified silicon ingots.
Figure 2A:
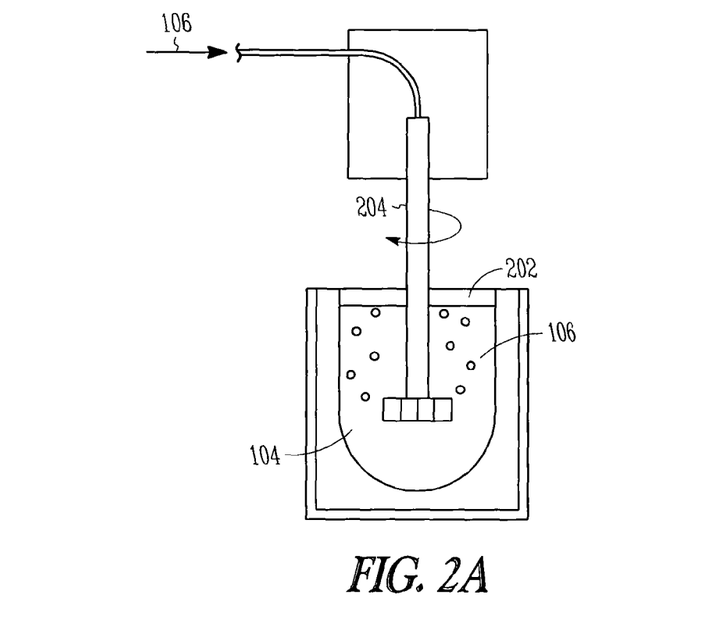
FIG. 2 illustrates an exemplary apparatus system useful for practicing the methods of the invention.
Figure 2B:
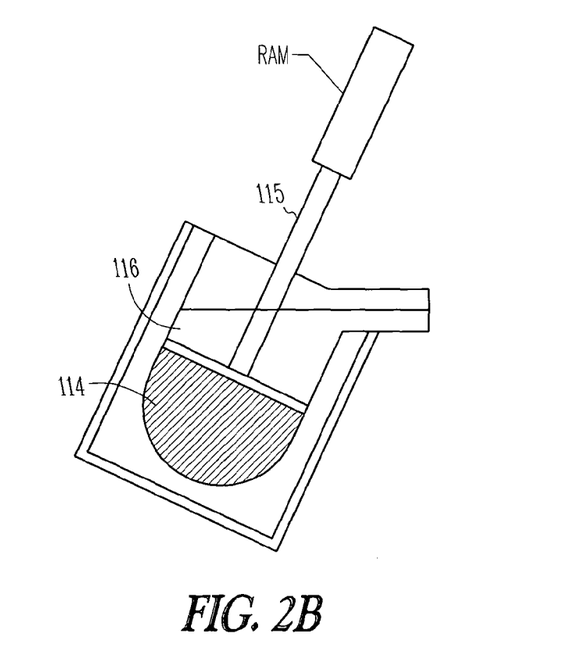
Figure 2C:
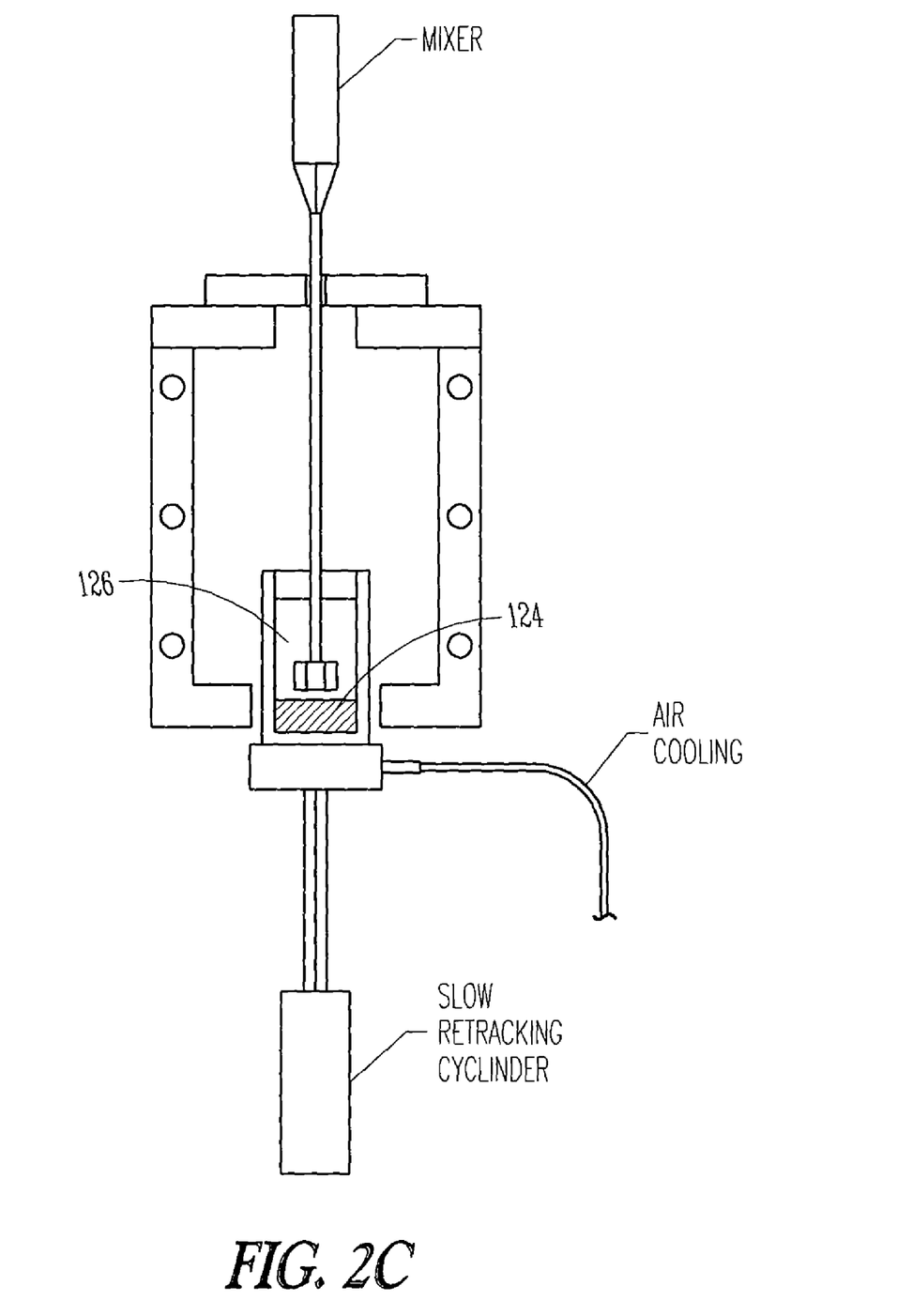
Figure 2D:
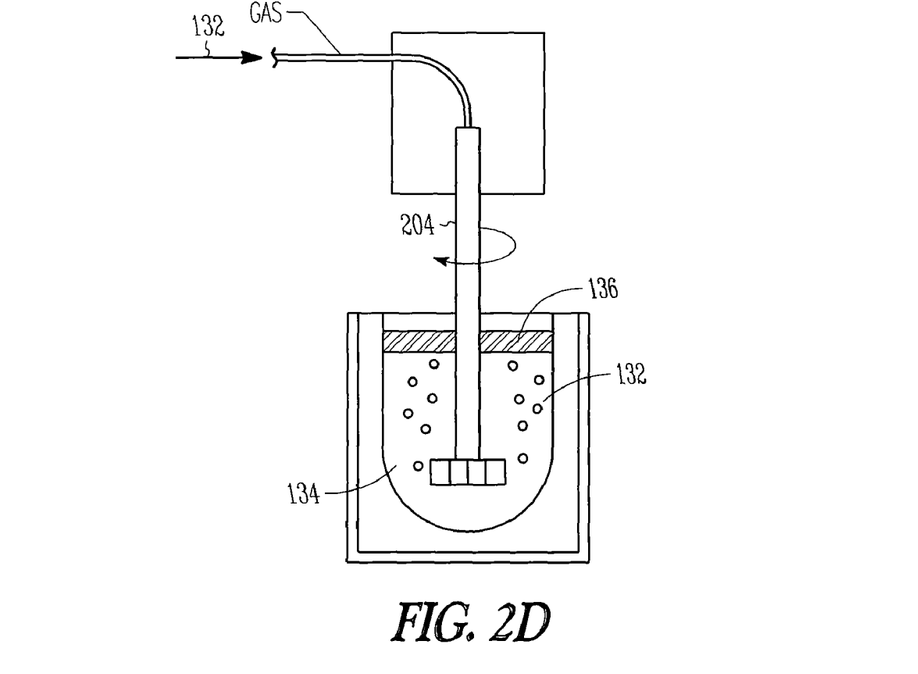
Figure 2E:
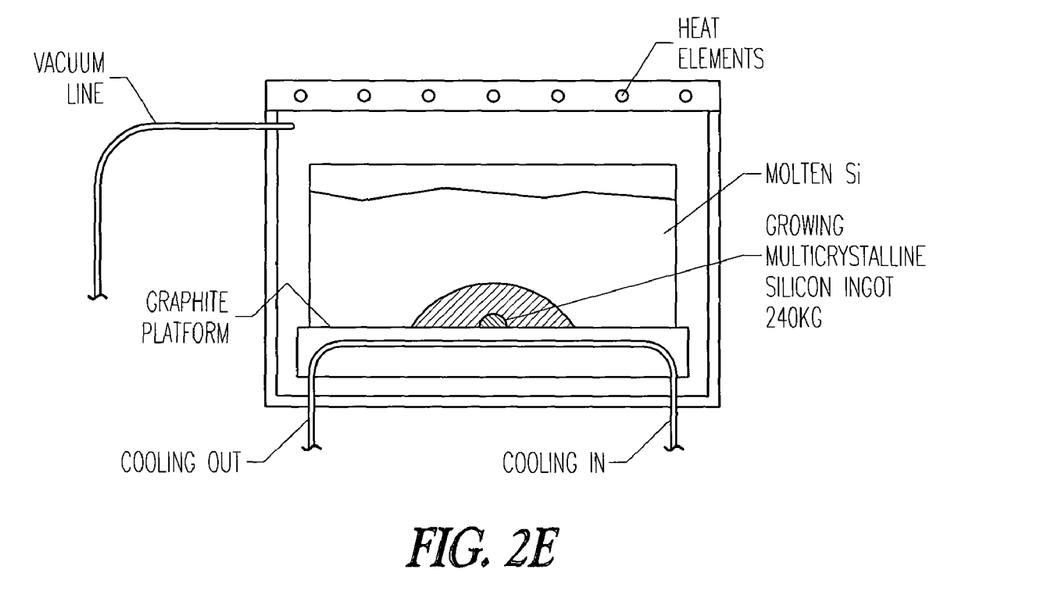
Figure 3:
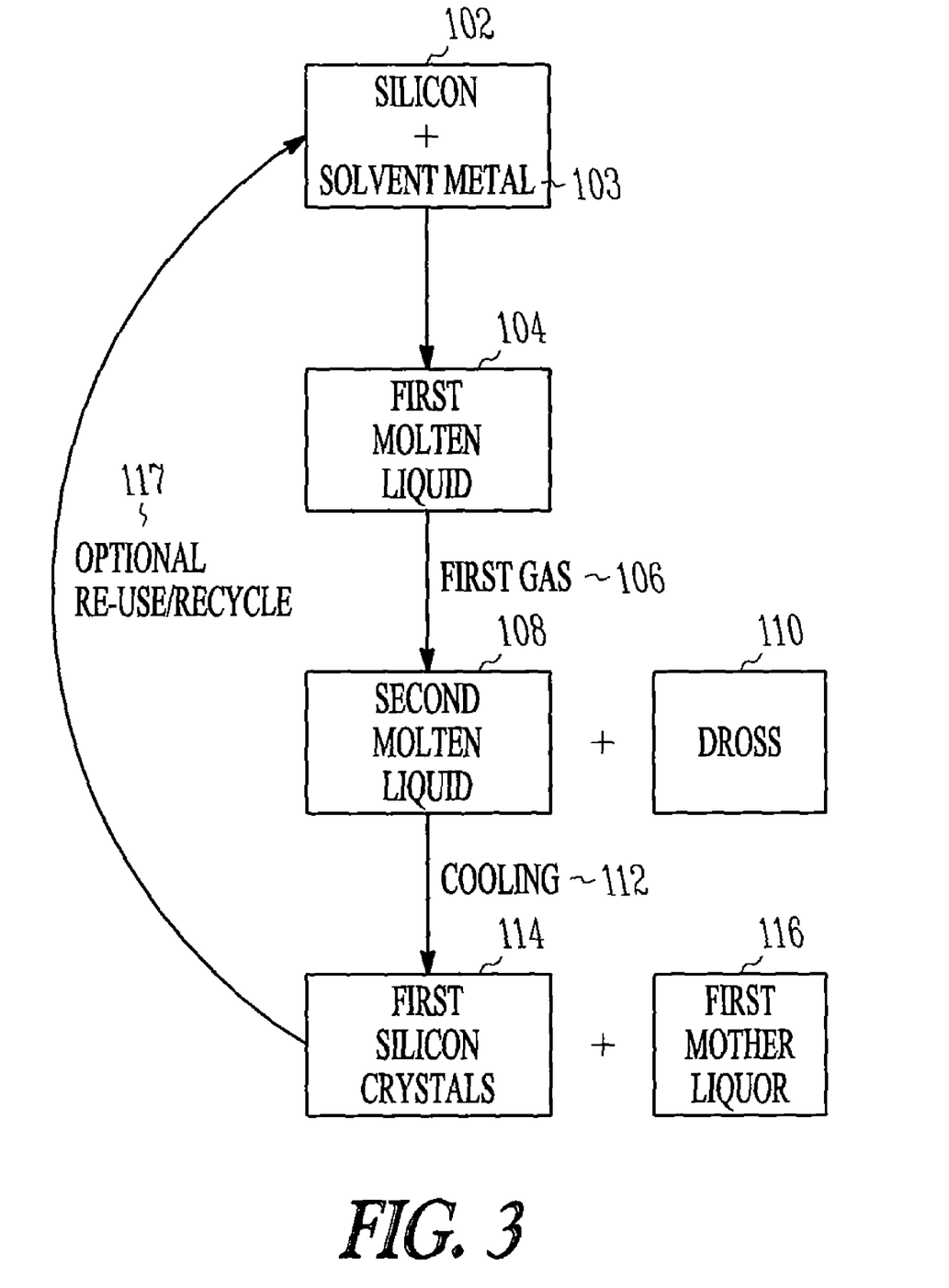
FIG. 3 illustrates a block flow diagram for methods of purifying silicon, methods for obtaining purified silicon, as well as methods for obtaining purified silicon crystals.

Referring to FIG. 1, methods of purifying silicon, methods for obtaining purified silicon, as well as methods for obtaining purified silicon crystals, purified granulized silicon and/or purified silicon ingots are provided. Referring to FIG. 2, an exemplary apparatus system useful for practicing the methods of the invention is provided. Referring to FIG. 3, methods of purifying silicon, methods for obtaining purified silicon, as well as methods for obtaining purified silicon crystals are provided.

Briefly stated, a first molten liquid (104) is formed from silicon (102) and a solvent metal (103). The first molten liquid (104) is contacted with a first gas (106), to provide a second molten liquid (108) and dross (110). The second molten liquid (108) is cooled to provide a first silicon crystals (114) and a first mother liquor (116). The first silicon crystals (114) can either be heated (118) or re-used (117), as described below.

Alternatively, a first molten liquid (104) is formed from silicon (102) and a solvent metal (103). The first molten liquid (104) is contacted with a first gas (106), to provide a second molten liquid (108) and dross (110). The second molten liquid (108) is cooled to provide a first silicon crystals (114) and a first mother liquor (116). The first silicon crystals (114) are heated to provide a first molten bath (120). The first molten bath (120) is directionally solidified (122) to provide second silicon crystals (124) and a second mother liquor (126). The second silicon crystals (124) are heated (128) to provide a second molten bath (130), which is contacted with a second gas (132) to provide a third molten bath (134) and slag (136). The third molten bath (134) can be introduced into a mold and cooled to provide second silicon (140). Alternatively, the third molten bath (134) can be cooled to provide silicon ingots (144). Alternatively, the third molten bath (134) can be converted into granulized silicon (148). Alternatively, the third molten bath (134) can be directionally solidified (150) to provide third silicon crystals (152), in which the upper and lower portions (154 and 155, respectively) can be separated (153). Upon separation (153), the upper portion (154) will include a third mother liquor (158) and the lower portion (155) will include third silicon crystals (156).

As stated above, a first molten liquid (104) is formed from silicon (102) and a solvent metal (103). The first molten liquid (104) should be completely molten, with no appreciable amount of slush present.

Any suitable silicon (102) can be employed. For example, metallurgical grade silicon or aluminum smelter grade silicon can be employed as the silicon (102). Additionally, the silicon (102) employed can include an appreciable amount (e.g., above about 10.0 ppm wt. %, above about 50.0 ppmwt. %, or above about 100 ppmwt. %) of impurities, such as phosphorous and boron. For example, the silicon (102) can be about 95 wt. % to about 99.9 wt. % pure. More specifically, the silicon (102) can include about 10 ppmwt % to about 120 ppmwt % boron and phosphorous. In one specific embodiment (see, FIG. 3), the silicon (102) employed can be the first silicon crystals (114) obtained in a previous purification.

The solvent metal (103) can include any suitable metal, combination of metals, or an alloy thereof, which upon heating, can effectively dissolve the silicon, resulting in a molten liquid. Suitable exemplary solvent metals (103) include, e.g., copper, tin, zinc, antimony, silver, bismuth, aluminum, cadmium, gallium, indium, magnesium, lead, an alloy thereof, and combinations thereof. One specific solvent metal (103) is aluminum, or an alloy thereof.

The silicon (102) and solvent metal (103) can each be present in any suitable amount or ratio, provided the first molten liquid (104) can effectively be formed. For example, the silicon (102) can be employed in about 20 wt. % to about 50 wt. %, and aluminum, or an alloy thereof, can be employed as the solvent metal (103), in about 50 wt. % to about 80 wt. %.

As stated above, the first molten liquid (104) is contacted with a first gas (106), to provide a second molten liquid (108) and dross (110). Without being bound to any particular theory, it is believed that the surface of the bubbles (202) of the first gas (106) effectively carry salts (e.g., $Mg^+$, $Ca^+$ and $Na^+$) from the first molten liquid (104), to the surface as dross (110). Specifically, the salts and other impurities are pulled to the surface of the second molten liquid (108) by adhesion to the first gas (106) bubbles (202), where they can be removed as dross (110). As such, relatively small bubbles (202), having a relatively large surface area to volume ratio, are particularly suitable in the present invention.

The first gas (106) employed can be directly introduced into the vesicle containing the first molten liquid (104). In such a situation, at least one of chlorine ($Cl_2$), oxygen ($O_2$), nitrogen ($N_2$), helium (He), argon (Ar), hydrogen ($H_2$), sulfur hexafluoride ($SF_6$), phosgene ($COCl_2$), carbon tetrachloride $CCl_4$, water vapor ($H_2O$), oxygen ($O_2$), carbon dioxide ($CO_2$), carbon monoxide (CO), tetrachlorosilane ($SiCl_4$) and tetrafluorosilane (SiF4) could be directly introduced into the vesicle containing the first molten liquid (104). Alternatively, the first gas (106) employed can be introduced into the vesicle containing the first molten liquid (104) as a precursor, that can effectively evolve the first gas (106). The precursor itself can be a solid or liquid or salt flux. Typically, the liquid or solid precursor will undergo a chemical reaction or decomposition to release the first gas (106), under the relatively high temperature of the first molten liquid (104).

In one specific embodiment, the first gas (106) includes 100 wt. % chlorine ($Cl_2$). In another specific embodiment, the first gas (106) includes chlorine ($Cl_2$) and nitrogen ($N_2$). In another specific embodiment, the first gas (106) includes chlorine ($Cl_2$) and nitrogen ($N_2$), in a ratio of up to about 1:20.

In one embodiment, the first molten liquid (104) can contact the first gas (106) employing a rotary degasser (204). The rotary degasser (204) can effectively introduce the first gas (106) into the first molten liquid (104). Additionally, the rotary degasser (204) can effectively agitate (e.g., stir) the first molten liquid (104) while the first gas (106) is introduced into the first molten liquid (104), creating relatively small bubbles.

The dross (110) can subsequently be removed from the second molten liquid (108), for example, using a skimmer. Typically, the dross (110) can be a white powder, semi-solid dross with oxides mixed with mother liquor or black powder, located on the surface of the second molten liquid (108). In one embodiment, the rotary degasser (204) can create a vortex of the second molten liquid (108), which can effectively mix the dross (110) in the second molten liquid (108). In such an embodiment, the vortex can contact oxygen to provide additional dross (110).

In one embodiment, the first molten liquid (104) can be cooled, prior to contacting with the first gas (106). Specifically, the first molten liquid (104) can be cooled, prior to contacting with the first gas (106), to below the liquidus temperature (e.g., within about 10° C. below the liquidus temperature). More specifically, the first molten liquid (104) can be cooled, prior to contacting with the first gas (106), to a temperature of less than about 825° C. More specifically, the first molten liquid (104) can be cooled, prior to contacting with the first gas (106), to a temperature of about 730° C. to about 815° C.

In one embodiment, the second molten liquid (108) can be heated after the first molten liquid (104) is contacted with the first gas (106), and before the dross (110) and second molten liquid (108) are separated. Specifically, the second molten liquid (108) can be heated, above the liquidus temperature, after the first molten liquid (104) is contacted with the first gas (106), and before the dross (110) and second molten liquid (108) are separated. More specifically, the second molten liquid (108) can be heated, to within about 20° C. above the liquidus temperature, after the first molten liquid (104) is contacted with the first gas (106), and before the dross (110) and second molten liquid (108) are separated.

As stated above, the second molten liquid (108) is cooled (112) to provide first silicon crystals (114) and a first mother liquor (116). In one embodiment, the second molten liquid (108) can be cooled (112) while agitating the second molten liquid (108). Without being bound to any particular theory, it is believed that during the cooling (112), agitating can provide relatively small silicon crystals (114), which can be difficult to strain, of a relatively high purity. A small amount of mixing can provide silicon crystals (114) of about 1 mm (thickness), by about 5 mm (width), by about 5 mm (length).

Additionally, the second molten liquid (108) can be cooled (112) to any suitable and appropriate temperature, provided first silicon crystals (114) are obtained in a first mother liquor (116). Specifically, the second molten liquid (108) can be cooled (112) to a temperature of less than about 700° C. More specifically, the second molten liquid (108) can be cooled (112) close to, but above the solidus temperature (e.g., within about 10° C. above the solidus temperature, within about 15° C. above the solidus temperature, or within about 25° C. above the solidus temperature). More specifically, the second molten liquid (108) can be cooled (112) to a temperature of about 650° C. to about 700° C. More specifically, the second molten liquid (108) can be cooled (112) to above the solidus temperature and below the liquidus temperature.

The second molten liquid (108) can be cooled (112) at any suitable any appropriate rate, provided first silicon crystals (114) are obtained in a first mother liquor (116). For example, the second molten liquid (108) can be cooled (112) at a rate of less than about 100° C./hr, at a rate of less than about 50° C./hr, or at a rate of less than about 20° C./hr.

The second molten liquid (108) can be cooled (112) over any suitable and appropriate period of time, provided first silicon crystals (114) are obtained in a first mother liquor (116). For example, the second molten liquid (108) can be cooled (112) over a period of time of at least about 2 hours, at least about 4 hours or at least about 8 hours.

In one embodiment, the first silicon crystals (114) and the first mother liquor (116) can be separated. The separation can be carried out in any suitable and appropriate manner. For example, the separation can be carried out by pouring off the first mother liquid (116) from the first silicon crystals (114) by straining. Alternatively, the separation can be carried out employing centrifugation. As can be seen in FIG. 2(b), a strainer (115) can be employed to apply pressure to the first silicon crystals (114), thereby assisting in the separation.

In one specific embodiment (see, FIG. 3), the first silicon crystals (114) obtained can be employed or re-used (117) as the silicon (102) in a subsequent purification. This re-use or recycling (117) can be carried out multiple times (e.g., 2, 3, 4 or 5), to provide first silicon crystals (114) having a requisite purity level.

As stated above, the first silicon crystals (114) are heated (118) to form a first molten bath (120). The first silicon crystals (114) can be heated (118) to any suitable and appropriate temperature, effective to form a first molten bath (120). Specifically, the first silicon crystals (114) can be heated (118) to a temperature of about 1100° C. to about 1500° C. Additionally, in one embodiment, the first silicon crystals (114) can be heated (118) in the presence of an inert gas, vacuum or a combination thereof. Suitable inert gases include, e.g., nitrogen ($N_2$), argon (Ar), or a combination thereof. Without being bound to any particular theory, it is believed that heating (118) the first silicon crystals (114) in the presence of an inert gas can prevent the formation of a dross and/or slag that includes silicon dioxide ($SiO_2$) at the elevated temperature (e.g., about 1100° C. to about 1500° C.). Such an oxidation of silicon to silicon dioxide could otherwise reduce the overall yield of the purified silicon.

As stated above, the first molten bath (120) is directionally solidified (122) to form second silicon crystals (124) and a second mother liquor (126). The direction solidification will allow crystals to form on the bottom of the vesicle (e.g., crucible), allowing the top part (i.e., molten) to be removed.

In one embodiment, the directional solidifying includes heating the top portion of the first molten bath, cooling the bottom portion of the first molten bath, or a combination thereof. Alternatively, the first molten bath (120) can be cooled, to form second silicon crystals (124) and a second mother liquor (126). Alternatively, the directional solidifying (122) can include cooling the first molten bath (120) below the melting point, thereby forming second silicon crystals (124), and separating the upper portion and the lower portion; wherein the upper portion comprises a second mother liquor (126) and the lower portion comprises second silicon crystals (124).

As stated above, the second silicon crystals (124) are heated (128) to provide a second molten bath (130). The second silicon crystals (124) can be heated (128), at any suitable and appropriate temperature, effective to provide a second molten bath (130). Specifically, the second silicon crystals (124) are heated (128), to a temperature above the liquidus temperature, to provide a second molten bath (130). More specifically, the second silicon crystals (124) can be heated (128), to a temperature of at least about of at least about 1300° C., to provide a second molten bath (130).

As stated above, the second molten bath (130) is contacted with a second gas (132) to provide a slag and/or dross (136) that forms on the surface of a third molten bath (134). The second gas (132) employed can be directly introduced into the vesicle containing the second molten bath (130). In such a situation, at least one of chlorine ($Cl_2$), oxygen ($O_2$), nitrogen ($N_2$), helium (He), argon (Ar), hydrogen ($H_2$), sulfur hexafluoride ($SF_6$), phosgene ($COCl_2$), carbon tetrachloride $CCl_4$, water vapor ($H_2O$), oxygen ($O_2$), carbon dioxide ($CO_2$), carbon monoxide (CO), tetrachlorosilane ($SiCl_4$) and tetrafluorosilane (SiF4) could be directly introduced into the vesicle containing the second molten bath (130). Alternatively, the second gas (132) employed can be introduced into the vesicle containing the second molten bath (130) as a precursor, that can effectively evolve the second gas (132). The precursor itself can be a solid or liquid. Typically, the liquid or solid precursor will undergo a chemical reaction or decomposition to release the second gas (132), under the relatively high temperature of the second molten bath (130).

In one embodiment, the second molten bath (130) can contact the second gas (132) employing a rotary degasser (204). The rotary degasser (204) can effectively introduce the second gas (132) into the second molten bath (130). Additionally, the rotary degasser (204) can effectively agitate (e.g., stir) the second molten bath (130) while the second gas (132) is introduced into the second molten bath (130).

In one embodiment, the rotary degasser (204) can create a vortex of the second molten bath (130), which can effectively mix the slag (136) in the third molten liquid (134). In another embodiment, the second molten bath (130) can be cooled, prior to contacting with the second gas (132). Specifically, the second molten bath (130) can be cooled, prior to contacting with the second gas (132), to below the liquidus temperature (e.g., within about 10° C. below the liquidus temperature).

In one embodiment, the third molten bath (134) can be heated after the second molten bath (130) is contacted with the second gas (132), and before the slag (136) and third molten liquid (134) are separated. Specifically, the third molten bath (134) can be heated, above the liquidus temperature, after the second molten bath (130) is contacted with the second gas (132), and before the slag (136) and third molten bath (134) are separated. More specifically, the third molten bath (134) can be heated, to within about 20° C. above the liquidus temperature, after the second molten bath (130) is contacted with the second gas (132), and before the slag (136) and third molten bath (134) are separated.

As stated above, the slag (136) and third molten bath (134) can be separated. They can be separated employing any suitable and appropriate methods. For example, the slag (136) can be removed from the third molten bath (134) using a skimmer.

As stated above, the third molten bath (134) can be directionally solidified (150) below the melting point, thereby forming a third silicon crystals (152). Additionally, the upper portion (154) and the lower portion (155) can be separated (153), wherein the upper portion (154) includes a third mother liquor (158) and the lower portion (155) includes a third silicon (156). In one embodiment, the directional solidification includes heating the top portion of the third molten bath (134), cooling the bottom portion of the third molten bath (134), or a combination thereof. Alternatively, the third molten bath (134) can be cooled (142), to provide silicon ingots (144).

The methods described herein can effectively provide commercial quantities (e.g., at least about 45 kg) of purified silicon, in a relatively cost-effective manner. More specifically, the methods described herein can effectively provide at least about 200 tons/year of purified silicon, at least about 500 tons/year of purified silicon, or at least about 1,000 tons/year of purified silicon, in a relatively cost-effective manner. The relatively pure silicon obtained can be, e.g., polycrystalline silicon or mono-crystalline silicon. Additionally, the relatively pure silicon obtained can be used to grow a multicrystalline or monocrystalline, string ribbon, spherical granule, ingot or boule. The relatively pure silicon obtained can be employed in the manufacture of a solar panel or an integrated circuit.

The relatively pure silicon obtained can be purified from at least one of lithium (Li), boron (B), sodium (Na), titanium (Ti), iron (Fe), magnesium (Mg), vanadium (V), zinc (Zn), phosphorous (P), sulfur (S), potassium (K), calcium (Ca), strontium (Sr), chlorine (Cl), chromium (Cr), manganese (Mn), aluminum (Al), arsenic (As), antimony (Sb), gallium (Ga), indium (In), nickel (Ni) and copper (Cu). Specifically, the relatively pure silicon obtained can include any one or more of the following, each in less than about 10 ppm: lithium (Li), boron (B), sodium (Na), titanium (Ti), iron (Fe), magnesium (Mg), vanadium (V), zinc (Zn), phosphorous (P), sulfur (S), potassium (K), calcium (Ca), strontium (Sr), chlorine (Cl), chromium (Cr), manganese (Mn), aluminum (Al), arsenic (As), antimony (Sb), gallium (Ga), indium (In), nickel (Ni) and copper (Cu). More specifically, the relatively pure silicon obtained can include any one or more of the following, each in less than about 10 ppm: iron (Fe) and aluminum (Al). Additionally, the relatively pure silicon obtained can include any one or more of the following, each in less than about 1 ppm: lithium (Li), boron (B), sodium (Na), titanium (Ti), magnesium (Mg), vanadium (V), zinc (Zn), phosphorous (P), sulfur (S), potassium (K), calcium (Ca), strontium (Sr), chlorine (Cl), chromium (Cr), manganese (Mn), arsenic (As), antimony (Sb), gallium (Ga), indium (In), nickel (Ni) and copper (Cu).

METHODS OF THE INVENTION

Each of the methods described herein can be carried out by any of the applicable techniques known to those of skill in the art of chemistry, metallurgy and materials science. The present invention will now be illustrated by the following actual and prophetic, non-limiting examples.

EXAMPLES

Example 1

Methods of Purifying Silicon

Step A: Removal of P Down to about 10 ppm

A 50-50 Al—Si mixture was melted by weight in an induction furnace until the mixture was completely molten at approximately 1000° C. A 1/3:1/3:1/3 mix of Cu:Al:Si also works well. The pure aluminium should have as low a phosphorous level as possible (e.g., about 1-10 ppm). The Cu should contain as low a phosphorous level (e.g., preferably less than about 30 ppm). Calcium can be added to help $Ca_3P_4$ precipitates form, if the metallurgical silicon is low in Calcium. This will make it easier for the phosphorous to be dragged by gas bubbles containing $Cl_2$ and inert gas to the surface. A gas with about 4% $Cl_2$ and 96% Argon was injected through a rotary impeller, spinning at about 800 RPM. The gas was injected for several hours until the phosphorous content was lowered to about 10 ppmw or low enough that the next step can reduce it to about 2 ppmw or less. Dross and salts were periodically scrimmed from the surface of the melt with a clean tool that will not contaminate the melt.

Step B: Removal of Majority of the Aluminum/Copper

The induction furnace was slowly cooled while mixing to about 700° C. from 1000° C., over about 4 hours. Slow cooling with mixing caused the crystals of silicon to slowly form improving their purity and size. Once 700° C. was reached, a large tamper was used to compact the crystals in the bottom of the furnace. The tamper should have many small holes in it about 3/16" in diameter to allow the liquid to escape through the tamper. The tamper should push straight down with enough force to tightly compact the crystals at the bottom of the furnace and not damage the furnace. While the tamper was down, the furnace was tilted to pour the liquid aluminum-silicon out of the furnace. The furnace was then reheated to remelt the remaining silicon crystals which were preferably 90% silicon and 10% Al. This step was repeated to improve the purity of the silicon. The aluminum-silicon liquid that was poured off during step B, can be sold to the aluminum foundry industry as a casting alloy.

Step C: Removal of Majority of Remaining Solvent Metal with Directional Solidification Once the silicon was liquid, the silicon was poured into a new crucible furnace for directional solidification. The silicon was lowered down through a heating zone so that the silicon in the bottom of the crucible froze first. Heat was removed through the bottom of the crucible with a cooled crucible stand. While the silicon was cooling, the liquid was mixed. The temperature was lowered until about 80% of the original liquid was frozen with the remaining 20% staying liquid on the top. The Aluminum-Silicon liquid from the top can be sold as an aluminum-silicon master alloy or recycle back into the start of the process. The bottom of the crucible was about 99% silicon with most of the aluminum staying on the top where it was poured out of the furnace. The remaining silicon was then reheated to a liquid state to start step D. The silicon had about 1% aluminum and the phosphorous was removed down to around 1-2 ppmw. Most of the Ca, Mg, Li, Sr and Na was removed. Ti and Fe was lowered to a level where a crystal growing process such as the Bridgman, float zone or Czochralski process removed the Ti and Fe to an acceptable level.

Step D Removal of Boron and Other Oxidizable Elements with Gas Injecting and Slagging A mixture of $H_2O$ vapour and/or 4% $O_2$ and 96% argon gas was injected through a rotary impeller spinning at about 800 RPM into the molten silicon at about 1475° C. for several hours. A slag began to form of $SiO_2$, $Al_2O_3$ and other oxidized elements. This slag was allowed to mix into the molten silicon. The slag was periodically removed. Alternatively, slag could have been added to the surface of the molten silicon. The impurities in the silicon preferred to be in the slag instead of the molten silicon. The slag must have as low a phosphorous level as reasonably possible to prevent contamination of the melt. The molten slag was allowed to mix into the molten silicon due to a vortex from the rotary degasser. This sped up the kinetics of the reactions and helped the impurity elements diffuse into the slag and salt. Flux injection can also be used for the addition of salt. After the impurities migrated to the slag or salt, the rotary impeller was slowed down to stop the vortexing action and allowed the slag/salt to float to the surface, sink to the bottom or stick to the edges of the crucible wear it was mechanically removed. The slag additions can be done in addition to the gas injection during step D.

Once the Boron was reduced to approximately 0.5 to 2 ppmw, 100% argon was injected through the impeller to allow the remaining oxides and carbides to float to the top of the melt, to be removed as slag. Care was taken that the rotary impeller was not causing a vortex at this stage; the rotary impeller was not slowed down. The furnace was covered, to minimize oxygen and carbon from the atmosphere from entering the melt. Dopants could have been added to the silicon at this point if needed, for many applications the boron concentration should be higher than the phosphorous. The molten silicon was then be poured through a ceramic foam filter to remove any excess oxides or carbides if needed. Vacuum treatment of the molten silicon also helped to remove the oxides and carbides. The silicon was now ready for processing in a commercially available method for example Bridgman, float zone, zone refining, multicrystalline directional solidification or Czochralski process. The resulting Silicon was transferred to (might be possible to file another patent on molten transfer or ingot size, so removed) the Bridgman process from step D) speeding up the process and reducing contamination with a lower surface area to mass ratio. The silicon can be sold before the last step is completed to another company who will do the crystal growing process.

Step E Directional Solidification

Directional solidification using Bridgman, Float zone, Czochralski or other known crystal or polycrystalline growing process was used to form boules or polycrystalline ingots. This step further reduced the impurities of the silicon to the required purity for solar cells.

There are several other possible ways to combine the steps to still get the observed results. The follow examples show some possible alternative ways of rearranging the steps to purify the silicon.

Example 2

The main difference between example 2 and example 1 is the injecting of gases and/or slagging of molten silicon first before adding of the solvent.

Step A) Injecting gases and mixing slag into the molten silicon. This step can lower the boron and phosphorous levels to acceptable levels so that steps C & D can further lower the phosphorous and boron concentrations to solar grade silicon levels. This step also lower elements like Ca, Mg, Al, Sr, Li, etc. which makes the directional solidification step easier.

Step B) Dissolving the Silicon in a solvent preferably aluminum, or aluminum and copper.

Step C) Use fractional crystallization to mechanically separate the majority of the solvent metal and silicon. The silicon crystals are formed by slowly cooling the molten mixture so that purified silicon crystals form. The silicon crystals can then be mechanically removed by several different possible methods. Preferable the crystals are separated with a tamp to hold the silicon crystals in the furnace while the molten mother liquid is poured out.

Step D) Directional solidification can then be used to separate the majority of the remaining solvent from the silicon. The melt can be slowly solidified with a temperature gradient and then the remaining mother liquid that is last to freeze can be poured off or removed. This step causes the phosphorous to be reduced because the phosphorous prefers to be in the molten solvent instead of the solidify silicon crystals.

Step E) Injecting gases and mixing slag into the molten silicon and mixing slag. This step can be competed with just gas injection or slagging or a combination of the two steps. Since the majority of the impurities have been already removed this steps focuses on removing the remaining solvent metal. If aluminum is used as the solvent metal, reactive gases containing oxygen will react with the aluminum to form aluminum oxide slag which can be removed from the melt. A system of injecting the gas in fine bubbles such as a rotary degasser helps improve the efficiency of this step.

Step F) Directional solidification/crystal pulling to form purified silicon using the Bridgeman, Float zone, Czochralski or other crystal growing processes.

Example 3

The main difference between example 3 and example 1 is the removal of step C directional solidification since injecting reactive gases such as oxygen can remove a solvent metal like aluminum as oxides.

I) Dissolving the Silicon in a solvent and injection gases or adding salts to remove impurities.

II) Using fractional crystallization to mechanically separate the majority of the solvent metal and silicon.

III) Injecting gases and mixing slag into the molten silicon to remove impurities and solvent.

IV) Directional solidification/crystal pulling to form purified silicon using the Bridgeman, Float zone, Czochralski or other crystal growing processes.

Example 4

The main difference between example 4 and example 1 is the removal of step B (fractional crystallization). Injecting reactive gases such as oxygen can remove a solvent metal like aluminum as oxides. Removed step B fractional crystallization injecting Oxygen can remove aluminum.

I) Dissolving the Silicon in an solvent and injection gases or adding salts to remove impurities.

II) Directional solidification to separate the majority of the remaining solvent from the silicon.

III) Injecting gases and mixing slag into the molten silicon.

IV) Directional solidification/crystal pulling to form purified silicon using the Bridgeman, Float zone, Czochralski or other crystal growing processes.

Example 5

Figure 4:
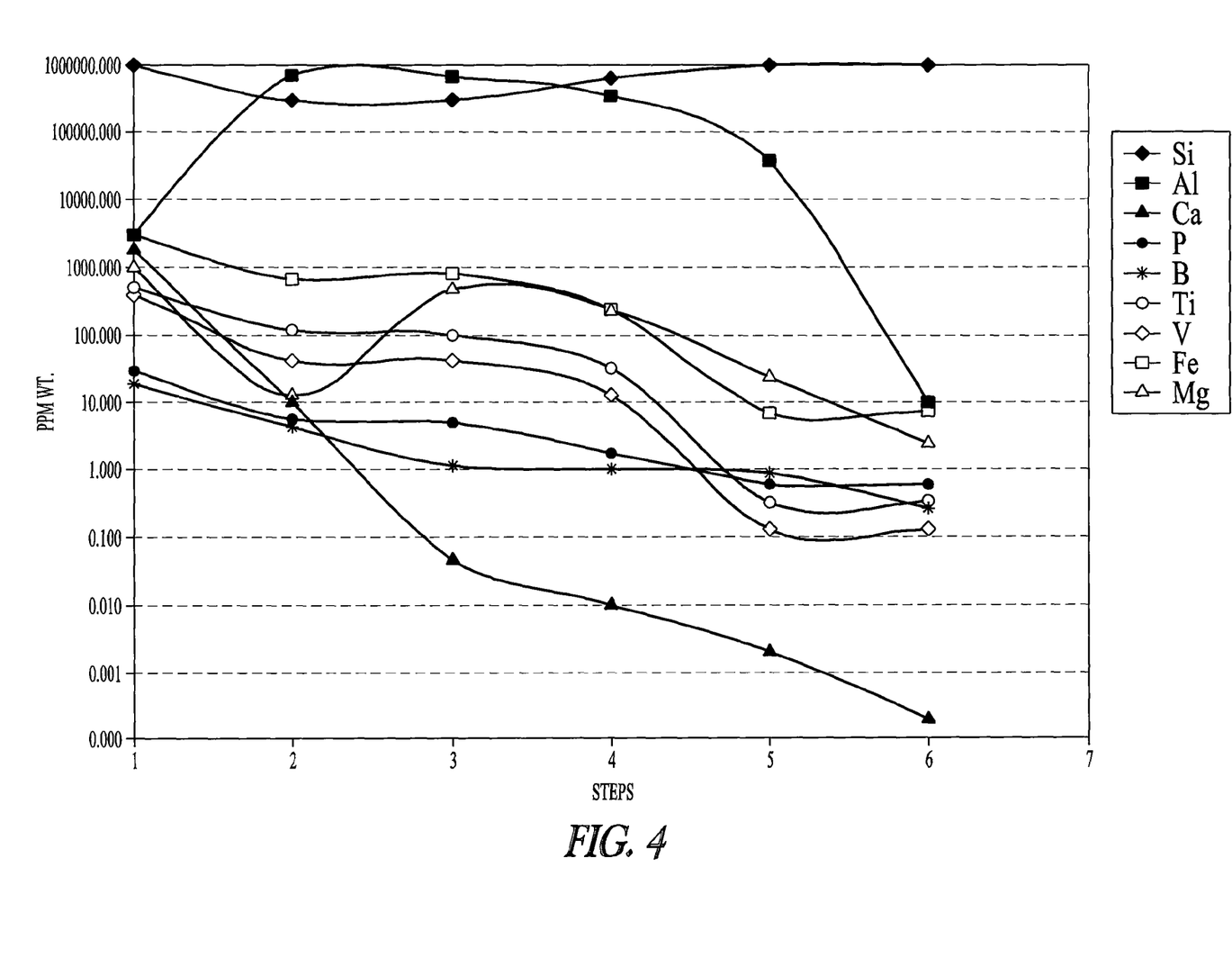
FIG. 4 illustrates a graphical view of impurity removal throughout an impurity removal process.

Impurities Removed from Silicon (See FIG. 4 and Table Below)

| | | | Strictly Confidential 6N Impurity Targets | | | | | |
|---|---|---|---|---|---|---|---|---|
| ppmwt % | MG Si | Al—Si | After Step I | After Step II | After Step III | After Step IV | After Step V | P0404 Primary Aluminum ppmwt % |
| Si | 990050 | 297155 | 297155 | 649550 | 964975 | 999979 | | 200 |
| Al | 3000 | 699817 | 699817 | 349909 | 34991 | 10 | | 998453 |
| Ca | 2000 | 10 | 0.05 | 0.01 | 0.00 | 0.00 | | 2 |
| P | 30 | 6 | 5.00 | 1.75 | 0.61 | 0.61 | | 5 |
| B | 20 | 4 | 1.10 | 0.99 | 0.89 | 0.27 | | 20 |
| Ti | 500 | 120 | 108.00 | 32.40 | 0.32 | 0.32 | | 10 |
| V | 400 | 43 | 43.00 | 12.90 | 0.13 | 0.13 | | 10 |
| Fe | 3000 | 680 | 810.00 | 243.00 | 7.29 | 7.29 | | 300 |
| Mg | 1000 | 13 | 500.00 | 250.00 | 25.00 | 2.50 | | 1000 |

| | Step I | Step II | Step III | Step IV | Step V |
|---|---|---|---|---|---|
| Dross loss % wt | 0 | 0 | 0.25 | 0.05 | n/a | 0.1 | 0.2 |
| Starting Si | 150 | 150 | 113 | 107 | 91 | 82 | 65 |
| Starting Al | 0 | 350 | 263 | 249 | 25 | 0 | 0 |
| Total | 150 | 500 | 375 | 356 | 116 | 82 | 65 |

| | | |
|---|---|---|
| Al | | 0.70% |
| Si | | 0.3% |
| Furnace size | | 500 kg |

| Removal (Segrgation) Coefficients | | | | | |
|---|---|---|---|---|---|
| | Step I | Step II | Step III | Step IV | Step V |
| Si | | | | | |
| Al | 1 | 0.5 | 0.1 | n/a | |
| Ca | n/a | 0.2 | 0.2 | 0.1 | |
| P | n/a | 0.35 | 0.35 | 1 | 0.35 |
| B | n/a | 0.9 | 0.9 | 0.3 | 0.8 |
| Ti | 0.9 | 0.3 | 0.01 | 1 | |
| V | 0.85 | 0.3 | 0.01 | 1 | |
| Fe | 1 | 0.3 | 0.03 | 1 | |
| Mg | n/a | 0.5 | 0.1 | 0.1 | |

Removal Coefficient: 1 means no removal, lower is better ie. 0.1 is one order of magnitude removal
Steps with N/A means the removal mechanism is gas injection instead of directional solidification
Values are estimates of required impurity removal and concentration at each step Obviously, numerous modifications and variations of the present invention are possible in light of the above teachings. It is therefore to be understood that within the scope of the appended claims, the invention may be practiced otherwise than as specifically described herein.

All publications, patents, and patent applications are incorporated herein by reference. While in the foregoing specification this invention has been described in relation to certain preferred embodiments thereof, and many details have been set forth for purposes of illustration, it will be apparent to those skilled in the art that the invention is susceptible to additional embodiments and that certain of the details described herein may be varied considerably without departing from the basic principles of the invention.

The invention claimed is:

1. A method for purifying silicon to solar-grade purity, the method comprising:
    (a) forming a first molten liquid from silicon and a solvent metal selected from the group of copper, tin, zinc, antimony, silver, bismuth, aluminum, cadmium, gallium, indium, magnesium, lead, an alloy thereof, and combinations thereof;
    (b) contacting the first molten liquid with a first gas, to provide a second molten liquid;
    (c) cooling the second molten liquid to form first silicon crystals and a first mother liquid;
    (d) separating the first silicon crystals and the first mother liquid;
    (e) heating the first silicon crystals to form a first molten bath;
    (f) directionally solidifying the first molten bath to form second silicon crystals and a second mother liquor;
    (g) separating the second silicon crystals and the second mother liquor;
    (h) heating the second silicon crystals to provide a second molten bath;
    (i) directionally solidifying the second molten bath below the melting point, thereby forming a third silicon crystals, and separating the upper portion and the lower portion; wherein the upper portion comprises a third mother liquor and the lower portion comprises a third silicon.

2. The method of claim 1, wherein in step (a), the first molten liquid is formed by heating above the liquidus temperature.

3. The method of claim 1, wherein in step (b), a rotary degasser creates a vortex.

4. The method of claim 1, wherein at least one of steps (a)-(d) is carried out multiple times.

5. The method of claim 1, wherein the sequence of steps (a)-(d) is carried out multiple times prior to carrying out step (e).

6. The method of claim 1, wherein the sequence of steps (a)-(d) is carried out multiple times prior to carrying out the sequence of steps (e)-(i), and the first mother liquid obtained in step (d) comprises the solvent metal in step (a) of a prior sequence of steps (a)-(d).

7. The method of claim 1, wherein the sequence of steps (a)-(d) is carried out multiple times prior to carrying out the sequence of steps (e)-(i), and the first silicon crystals obtained in step (d) comprise the silicon in step (a) of a subsequent sequence of steps (a)-(d).

8. A method of manufacturing solar cells, the method comprising making solar cells that comprise the third silicon of claim 1.

9. A method for purifying silicon to solar-grade purity, the method comprising:
    (a) forming a first molten liquid from silicon and a solvent metal selected from the group of copper, tin, zinc, antimony, silver, bismuth, aluminum, cadmium, gallium, indium, magnesium, lead, an alloy thereof, and combinations thereof;
    (b) contacting the first molten liquid with a first gas, to provide a second molten liquid;
    (c) cooling the second molten liquid to form first silicon crystals and a first mother liquid;
    (d) separating the first silicon crystals and the first mother liquid;
    (e) heating the first silicon crystals to form a first molten bath;
    (f) directionally solidifying the first molten bath to form second silicon crystals and a second mother liquor;
    (g) separating the second silicon crystals and the second mother liquor;
    (h) heating the second silicon crystals to provide a second molten bath;
    (i) contacting the second molten bath with a second gas to provide a slag that forms on the surface of a third molten bath; and,
    (j) separating the slag and the third molten bath.

10. The method of claim 9, wherein in step (a), the first molten liquid is formed by heating above the liquidus temperature.

11. The method of claim 9, after steps (a)-(j) further comprising:
    (k) heating the second silicon crystals to provide a second molten bath;
    (l) contacting the second molten bath with a second gas to provide a slag that forms on the surface of a third molten bath; and,
    (m) separating the slag and the third molten bath.

12. The method of claim 11, after step (m) further comprising:
    (n) cooling the third molten bath to form silicon ingots.

13. The method of claim 11, after step (m) further comprising:
    (n) contacting the third molten bath with water to form granulized silicon.

14. The method of claim 11, after step (m) further comprising:
    (n) introducing the third molten bath into a mold and cooling the third molten bath to form a second silicon.

15. The method of claim 11, wherein the sequence of steps (a)-(d) is carried out multiple times prior to carrying out the sequence of steps (e)-(j), and the first mother liquid obtained in step (d) comprises the solvent metal in step (a) of a prior sequence of steps (a)-(d).

16. The method of claim 11, wherein the sequence of steps (a)-(d) is carried out multiple times prior to carrying out the sequence of steps (e)-(j), and the first silicon crystals obtained in step (d) comprise the silicon in step (a) of a subsequent sequence of steps (a)-(d).

17. The method of claim 9, wherein in step (b), a vortex is created.

18. The method of claim 9, wherein at least one of steps (a)-(d) is carried out multiple times.

19. The method of claim 9, wherein the sequence of steps (a)-(d) is carried out multiple times prior to carrying out step (e).

20. A method of manufacturing solar cells, the method comprising making solar cells that comprise the third silicon of claim 9.

* * * * *

UNITED STATES PATENT AND TRADEMARK OFFICE
CERTIFICATE OF CORRECTION

PATENT NO.        : 7,883,680 B2
APPLICATION NO.   : 12/784576
DATED             : February 8, 2011
INVENTOR(S)       : Scott Nichol It is certified that error appears in the above-identified patent and that said Letters Patent is hereby corrected as shown below:

On the title page, in item (56), under "Other Publications", in column 2, line 9, delete "Offfice" and insert -- Office --, therefor.

On the title page, in item (74), under "Attorney, Agent, or Firm", in column 2, line 1, delete "Lundgerg" and insert -- Lundberg --, therefor.

In column 5, lines 62-63, delete "(fosterite" and insert -- (forsterite --, therefor.

In column 15, line 14, delete "Bridgeman," and insert -- Bridgman, --, therefor.

In column 16, line 4, delete "Bridgeman," and insert -- Bridgman, --, therefor.

In column 16, line 14, delete "an" and insert -- a --, therefor.

In column 16, line 21, delete "Bridgeman," and insert -- Bridgman, --, therefor.

In column 15-16, line 22, delete "(Segrgation)" and insert -- (Segregation) --, therefor.

Signed and Sealed this
Twelfth Day of April, 2011

David J. Kappos
*Director of the United States Patent and Trademark Office*